US010585630B2

United States Patent
Rakshit et al.

(10) Patent No.: US 10,585,630 B2
(45) Date of Patent: Mar. 10, 2020

(54) SELECTORLESS 3D STACKABLE MEMORY

(71) Applicant: Samsung Electronics Co., Ltd., Gyeonggi-do (KR)

(72) Inventors: Titash Rakshit, Austin, TX (US); Borna J. Obradovic, Leander, TX (US); Ryan M. Hatcher, Austin, TX (US); Vladimir Nikitin, Campbell, CA (US); Dmytro Apalkov, San Jose, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/845,985

(22) Filed: Dec. 18, 2017

(65) Prior Publication Data

US 2019/0079701 A1 Mar. 14, 2019

Related U.S. Application Data

(60) Provisional application No. 62/556,855, filed on Sep. 11, 2017.

(51) Int. Cl.
*H01L 21/822* (2006.01)
*H01L 27/22* (2006.01)
(Continued)

(52) U.S. Cl.
CPC .......... *G06F 3/0679* (2013.01); *G06F 3/0605* (2013.01); *G06F 3/0616* (2013.01);
(Continued)

(58) Field of Classification Search
CPC .......... H01L 21/8221; H01L 27/11578; G06F 3/0605; G06F 3/0616; G06F 3/0659; G06F 3/0679
See application file for complete search history.

(56) References Cited

U.S. PATENT DOCUMENTS 6,924,520 B2   8/2005   Park et al.
7,166,881 B2   1/2007   Lin et al.
(Continued)

FOREIGN PATENT DOCUMENTS

WO   2015116416   8/2015

OTHER PUBLICATIONS

Highly Functional and Reliable 8Mb STT-MRAM Embedded in 28nm Logic, H.Lee, et al., Samsung Corporation, 978-5090-3902—Sep. 2016, IEEE, Sep. 2016.
(Continued)

*Primary Examiner* — Joseph M Galvin, III
(74) *Attorney, Agent, or Firm* — Van Pelt, Yi & James LLP

(57) ABSTRACT

A memory device and method for providing the memory device are described. The memory device includes word lines, a first plurality of bit lines, a second plurality of bit lines and selectorless memory cells. Each selectorless memory cell is coupled with a word line, a first bit line of the first plurality of bit lines and a second bit line of the second plurality of bit lines. The selectorless memory cell includes first and second magnetic junctions. The first and second magnetic junctions are each programmable using a spin-orbit interaction torque. The word line is coupled between the first and second magnetic junctions. The first and second bit lines are coupled with the first and second magnetic junctions, respectively. The selectorless memory cell is selected for a write operation based on voltages in the word line, the first bit line and the second bit line.

16 Claims, 7 Drawing Sheets

(51) Int. Cl.
  *G06F 3/06* (2006.01)
  *H01L 27/11578* (2017.01)
  *H01L 21/3105* (2006.01)
  *G11C 11/16* (2006.01)
  *G11C 11/18* (2006.01)
  *H01L 43/08* (2006.01)

(52) U.S. Cl.
  CPC ............ *G06F 3/0659* (2013.01); *G11C 11/16* (2013.01); *G11C 11/161* (2013.01); *G11C 11/1673* (2013.01); *G11C 11/1675* (2013.01); *G11C 11/18* (2013.01); *H01L 21/3105* (2013.01); *H01L 21/8221* (2013.01); *H01L 27/11578* (2013.01); *H01L 27/222* (2013.01); *H01L 43/08* (2013.01)

(56) References Cited

U.S. PATENT DOCUMENTS

| | | | |
|---|---|---|---|
| 8,125,040 | B2 | 2/2012 | Kang |
| 8,681,537 | B2* | 3/2014 | Lee ..................... G11C 5/063 365/148 |
| 9,608,039 | B1 | 3/2017 | Apalkov |
| 9,646,670 | B2 | 5/2017 | Lee et al. |
| 9,721,632 | B2 | 8/2017 | Houssameddine |
| 2004/0125673 | A1* | 7/2004 | Daughton ............... G11C 11/15 365/200 |
| 2014/0204661 | A1 | 7/2014 | Doyle et al. |
| 2015/0213868 | A1 | 7/2015 | Wu et al. |
| 2015/0249096 | A1* | 9/2015 | Lupino ............ H01L 27/11898 257/203 |
| 2016/0064650 | A1* | 3/2016 | Wang ................... H01L 27/228 257/427 |
| 2016/0276006 | A1* | 9/2016 | Ralph ..................... G11C 11/18 |
| 2017/0092842 | A1 | 3/2017 | Khalili et al. |
| 2017/0117027 | A1 | 4/2017 | Braganca et al. |
| 2017/0148978 | A1* | 5/2017 | Apalkov ............... G11C 11/161 |
| 2017/0178705 | A1* | 6/2017 | Buhrman ............... H01L 43/08 |

OTHER PUBLICATIONS

Voltage-Control Spintronics Memory (VoCSM) Having Potentials of Ultra-Low Energy-Consumption and High Density; H.Yoda et al., Toshiba Corporation, 978-1-5090-3902—Sep. 2016, IEEE, Sep. 2016.

Field-free Magnetization Reversal by Spin-Hall Effect and Exhange Bias, A. van den Brink, et al., Eindhoven University of Technology, Nature Communications, DOI: 10.1038/ncomms10854, Mar. 2016.

Spin-Torque Switching with the Giant Spin Hall Effect of Tantalum, L.Liu, et al., Cornell University, Science, vol. 336, May 2012.

* cited by examiner

SELECTORLESS 3D STACKABLE MEMORY

CROSS-REFERENCE TO RELATED APPLICATIONS

This application claims the benefit of provisional Patent Application Ser. No. 62/556,855, filed Sep. 11, 2017, entitled "SELECTORLESS 3D STACKABLE CROSSPOINT MEMORY BASED ON SOT AND VCMA", assigned to the assignee of the present application, and incorporated herein by reference.

BACKGROUND

The trend in semiconductor memory arrays is toward increased areal density. Although a reduction in size provides some increase in areal density, other approaches may provide additional benefits. Three-dimensional (3D) crosspoint memory arrays allow for 3D stacked integration of memory cells. The stacking of memory cells results in a higher areal memory density. Each memory cell in such a 3D crosspoint memory array typically includes a memory element connected in series with a selection device. The memory element may be a magnetic tunneling junction or other resistive device. The selection device for such a memory cell is typically a transistor. The 3D crosspoint memory array also includes bit lines, word lines, and source lines. Bit lines are coupled to one end of the magnetic junctions, while the source lines are connected to the sources of the transistors. Word lines provide a selection voltage to the gates of the transistors. When the transistor is enabled, the selected memory cell may be written or read.

Although providing an additional avenue for increasing areal memory density, 3D stackable memory arrays have limitations. The 3D stackable memory arrays may have high power requirements for access. As such, the ability to integrate 3D stackable memories into certain technologies, such as system-on-a-chip (SoC) devices, may be limited. However, because of their potential for use increasing areal memory density, research in 3D stackable memories is ongoing.

BRIEF SUMMARY OF THE INVENTION

A memory device and method for providing the memory device are described. The memory device includes word lines, a first plurality of bit lines, a second plurality of bit lines and selectorless memory cells. Each selectorless memory cell is coupled with a word line, a first bit line of the first plurality of bit lines and a second bit line of the second plurality of bit lines. The selectorless memory cell includes first and second magnetic junctions. The first and second magnetic junctions are each programmable using a spin-orbit interaction torque. The word line is coupled between the first and second magnetic junctions. The first and second bit lines are coupled with the first and second magnetic junctions, respectively. The selectorless memory cell is selected for a write operation based on voltages in the word line, the first bit line and the second bit line.

The memory device may have reduced area and voltage requirements and may be used as a 3D memory array. As a result, memory density may be improved and the 3D memory array may be integrated into additional technologies.

DETAILED DESCRIPTION OF THE INVENTION

Figure 1A:
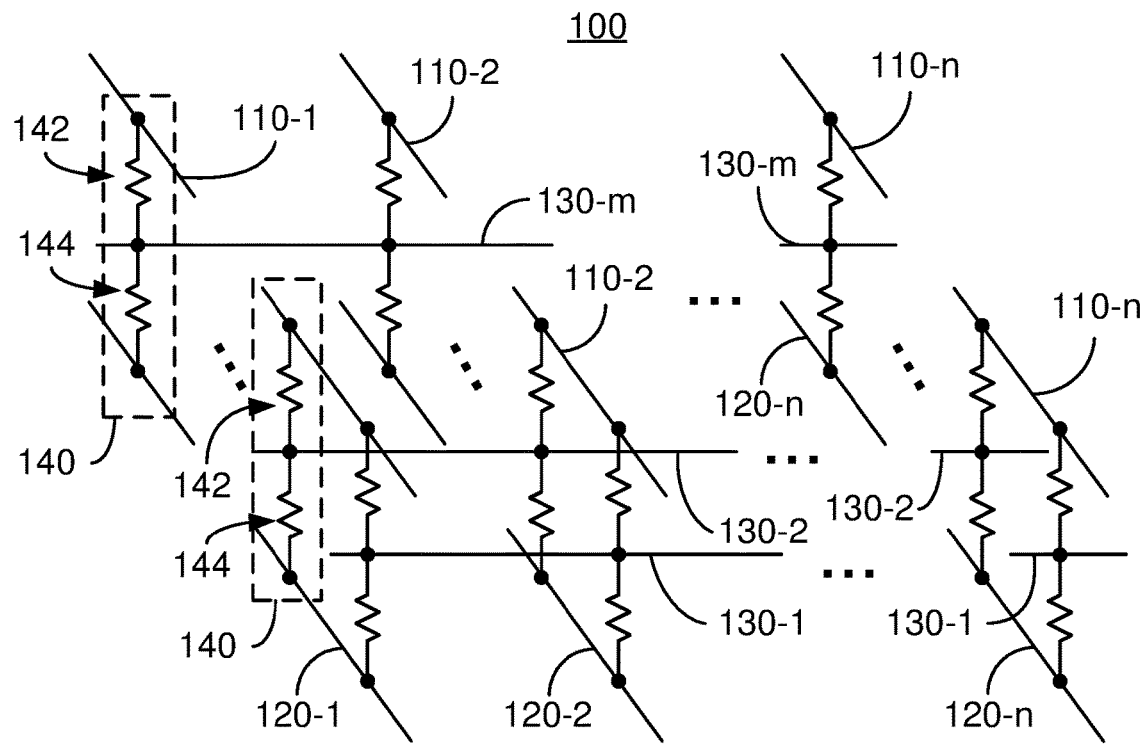
FIGS. 1A-1C depict portions of an exemplary embodiment of a selectorless memory that may be configured as a three-dimensional stackable memory and the energy states for such a memory.

The exemplary embodiments relate to electronic devices such as those employing nonvolatile memory. Such electronic devices include but are not limited to cellular phones, smart phones, tablets, laptops, computer systems, system on a chip (SoC) devices, servers, logic devices and other portable and non-portable computing devices or components. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations.

Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or fewer components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

The exemplary embodiments are described in the context of particular methods, magnetic junctions and memories having certain components. One of ordinary skill in the art will readily recognize that the present invention is consistent with the use of magnetic junctions and memories having other and/or additional components and/or other features not inconsistent with the present invention. The method and system are also described in the context of current understanding of the spin-orbit torque and other physical phenomenon. However, the method and system described herein are not dependent upon a particular physical explanation. One of ordinary skill in the art will also readily recognize that the method and system are described in the context of a structure having a particular relationship to the substrate. One of ordinary skill in the art will readily recognize that the method and system are consistent with other structures. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction.

A memory device and method for providing the memory device are described. The memory device includes word lines, a first plurality of bit lines, a second plurality of bit lines and selectorless memory cells. Each selectorless memory cell is coupled with a word line, a first bit line of the first plurality of bit lines and a second bit line of the second plurality of bit lines. The selectorless memory cell includes first and second magnetic junctions. The first and second magnetic junctions are each programmable using a spin-orbit interaction torque. The word line is coupled between the first and second magnetic junctions. The first and second bit lines are coupled with the first and second magnetic junctions, respectively. The selectorless memory cell is selected for a write operation based on voltages in the word line, the first bit line and the second bit line.

Figure 1B:
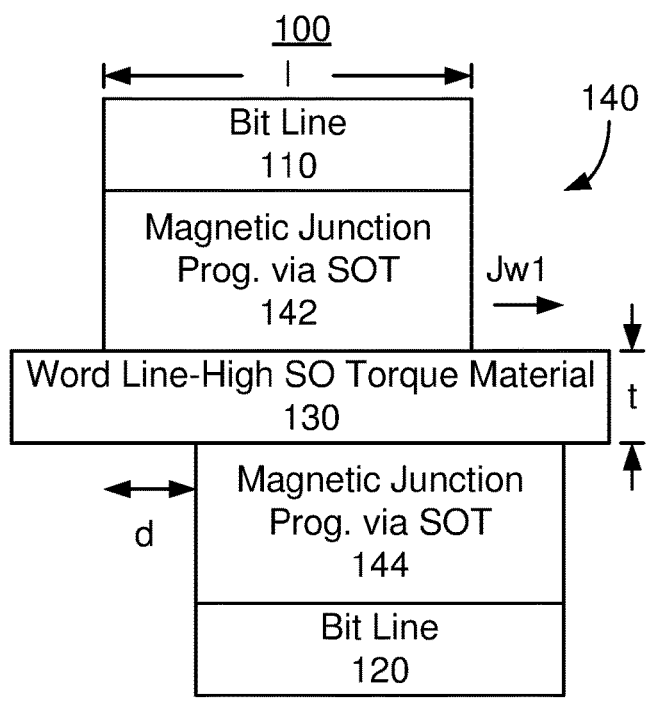
Figure 1C:
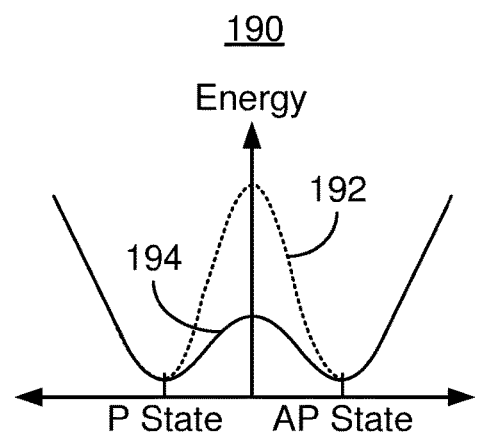

FIGS. 1A-1C depict portions of an exemplary embodiment of a selectorless memory 100 that may be configured as a three-dimensional (3D) stackable memory and the energy states for such a memory. FIG. 1A is a perspective view indicating the circuit components of the memory 100. FIG. 1B depicts a cross-sectional view of a portion of the memory 100. FIG. 1C depicts the energy versus magnetic state of a portion of the memory 100. For clarity, FIGS. 1A-1C are not to scale and not all components may be shown.

The selectorless memory 100 includes first of bit lines (referred to generically as bit lines 110), second bit lines (referred to generically as bit lines 120), word lines (referred to generically as word lines 130) and selectorless memory cells 140. For simplicity, only two of the selectorless memory cells 140 are denoted by a dashed rectangle and the corresponding item number in FIG. 1A. In the embodiment shown, there are n first bit lines 110-1 through 110-n, n second bit lines 110-1 through 110-n and m word lines 130-1 through 130-m. The first bit lines 110 and second bit lines 120 are substantially parallel. The bit lines 110 and 120 are also substantially perpendicular to the word lines 130. However, in other embodiments, the lines 110, 120 and 130 may be at other angle(s). For example, the bit lines 110 and 120 may be parallel but may not be perpendicular to the word lines 130, as long as the bit lines 110 and 120 cross the word lines 130.

Each selectorless memory cell 140 includes multiple magnetic junctions. In the embodiment shown, a selectorless memory cell 140 includes two magnetic junctions 142 and 144. In an alternate embodiment, another number of magnetic junctions may be included. The magnetic junctions 142 and 144 are shown as resistors in FIGS. 1A and 1n cross-section in FIG. 1B. Each magnetic junction 142 and 144 includes a free layer in proximity to the word line 130, a reference layer and a nonmagnetic spacer layer between the free and reference layers. The word lines 130 are connected between the magnetic junctions 142 and 144, while the bit lines 110 and 120 are connected to the top and bottom of the magnetic junctions 142 and 144, respectively. As seen in FIG. 1B, the magnetic junctions 142 and 144 may be offset in the in-plane direction by a distance d. Although d is shown as less than I (the length of a magnetic junction), this is not required. However, the smaller the offset, d, the less area a particular memory cell 140 occupies. Consequently, a zero offset (d=0) is generally desired.

The magnetic junctions 142 and 144 are programmable via spin-orbit interaction (SO) torque. The SO torque is provided by a write current driven through the word line 130 connected to the cell(s) 140 desired to be switched. Because of the material(s) used in the word line 130, spins polarized in a particular direction accumulate at the interfaces with the magnetic junctions 142 and 144 when a current is driven through the word line 130. These spins exert an SO torque on the free layers of the magnetic junctions 142 and 144. For the current shown, Jw1, the SO torque is in a first direction. A current −Jw1 in the opposite direction provides an SO torque opposite to the first direction. Consequently, the SO torque, alone or in combination with another effect, can switch the magnetic moments of the free layers of the magnetic junctions 142 and 144 between stable states. The magnetic junctions 142 and 144 and, therefore, the memory cells 140 are programmed using SO torque.

To improve the ability of the word line 130 to write to the magnetic junctions 142 and 144, the material(s) that provide a high SO torque (high SO materials) may be selected for the word line 130. The SO torque may be due to the spin Hall effect or another analogous spin-orbit interaction effect that is characteristic of the word line 130. Therefore, materials having a high spin Hall effect, such as Pt, β-Ta and/or BiCu, may be desired for the word line 130. Such materials can efficiently transduce charge current into spin polarized current and, therefore, have a high spin Hall angle. Materials having a spin Hall angle greater than 0.05 are desired. In some embodiments, the spin Hall angle may as high as 0.3 or more for the word line 130. Other high SO materials may be used for the word line 130 in other embodiments.

In some embodiments, the word line 130 may have a thin cross-section. For example, the thickness, t, may be not more than five nanometers. In some embodiments, the t is at least two nanometers and not more than five nanometers. In other embodiments, t is at least one nanometer and not more than ten nanometers. To improve resistivity of the word line 130 at such reduced thicknesses, the word line 130 may be doped. In some embodiments, resistivity may be improved by using the high SO material only in the regions adjacent to the memory cells 140. Higher conductivity, low SO material(s) can be used for the portions of the word lines 130 between the memory cells 140. In some embodiments, the size of the array may be reduced if the material(s) used in the word line 130 are highly resistive.

In addition to being programmable via SO torque, the magnetic junctions 142 and 144 are selectable via voltage controlled magnetic anisotropy (VCMA). Use of VCMA allows the memory cells 140 to be selectorless. A selectorless memory cell 140 need not include a transistor or other component used to select the memory cell 140 for programming. Instead, the application of an appropriate voltage across the magnetic junction 142 or 144 selects the corresponding memory cell 140 for writing. More specifically, the voltage applied to the magnetic junction 142 or 144 during writing reduces the magnetic anisotropy for the free layer of the magnetic junction 142 or 144, allowing the magnetic junction 142 or 144 to be programmed. During reading or a hold, the voltages applied to the magnetic junctions 142 and 144 are selected such that the magnetic anisotropy is not decreased and the magnetic junctions 142 and 144 may not be inadvertently programed.

Selection of memory cells 140 via VCMA may be further explained with respect to graph 190 of FIG. 1C. Curves 192 and 194 depict the energy state of the magnetic junction 142 or 144 under read conditions and programing conditions, respectively. The curves 192 and 194 are for explanatory purposes only and not intended to correspond to a specific magnetic junction. The stable states of a magnetic junction 142 or 144 are where the energy minima occur for the curves 192 and 194. The stable states for the magnetic junctions 142 and 144 are the P state (free layer magnetic moment parallel to the reference layer magnetic moment) and the AP state (free layer magnetic moment antiparallel to the reference layer magnetic moment). Curves 192 and 194 each exhibit a local maximum, or energy barrier, between the stable states. In order to switch between the P and AP states, the energy barrier is overcome. The energy barrier is due in large part to the magnetic anisotropy of the free layer of a magnetic junction 142 or 144. Differences in the magnetic anisotropy of the free layer cause differences in the heights of the energy barriers for the curves 192 and 194. When a voltage is applied across the magnet junction 142 or 144 for a read operation, the magnetic anisotropy remains high. Consequently, the energy barrier for curve 192 is high and the magnetic junctions 142 and 144 are less likely to be switched. In contrast, when the appropriate voltage is applied across the magnetic junction 142 and 144 for a write operation, the magnetic anisotropy is reduced. The energy barrier between stable states for the curve 194 is reduced, making the magnetic junctions 142 and 144 more likely to switch. A lower SO torque and, therefore, a lower write current driven through the word line 130 may overcome this energy barrier, changing the state of the magnetic junctions 142 and 144. This same write current and SO torque may not switch a magnetic junction not selected for programming because the energy barrier may be higher.

During a write operation, voltages are applied to the word line 130 and bit lines 110 and 120 connected to the memory cell(s) 140 selected for programming. This results in the curve 194 for each of the magnetic junctions 142 and 144 in the selected memory cell(s). The voltage applied to the word line 130 may be close to the supply voltage Vdd. The voltage(s) applied to the bit lines 110 and 120 are small, for example less than or equal to 0.2*Vdd. The supply voltage Vdd may be in the range of 0.8V to 1.5V, which is sufficiently low to be compatible with SoC devices. In some embodiments, the voltages applied to the word line 130 and bit lines 110 and 120 may be ±0.8*Vdd and −0.4*Vdd, respectively. The resulting voltage across the magnetic junctions 142 and 144 lowers the energy barrier to facilitate programming for the selected memory cells 140.

Also during a write operation, a write current is driven through the selected word line 130 in the desired direction (along Jw1 or −Jw1). Due to the spin Hall effect or other SO coupling, the current through the word line 130 results in an SO torque applied to the free layers of the magnetic junctions 142 and 144 in the selected memory cell(s) 140. Because of the reduction in the energy barrier, the SO torque is sufficient to switch the state of the magnetic junctions 142 and 144 in the selected memory cell(s) 140. For the spin Hall effect, SO torques in opposite directions are applied to the magnetic junctions 142 and 144 because the magnetic junctions 142 and 144 are on opposite sides of the word line 130. Consequently, the magnetic junctions 142 and 144 are programmed to complementary states. The magnetic junction 142 is in the P (0) state when the magnetic junction 144 is in the AP (1) state and vice versa. For example, the current Jw1 may write the magnetic junctions 142 and 144 to the I/O (AP/P) state. A current −Jw1 in the opposite direction writes the magnetic junctions 142 and 144 to the 0/1 (P/AP) state.

For a read operation, the voltages applied to the word line 130 and bit lines 110 and 120 connected to the selected memory cell(s) 140 result in the curve 192 for the magnetic junctions 142 and 144 of the selected memory cell(s) 140. As a result, the magnetic junctions 142 and 144 being read are unlikely to be inadvertently switched. For example, the word line 130 may be at nominally 0.5*Vdd, while the bit lines 110 and 120 float. As discussed above, one magnetic junction 142 or 144 of a memory cell 140 is in the P state while the other 144 or 142, respectively, is in the AP state. The bit line 110 or 120 connected to the word line 130 through low the resistance (P state) magnetic junction 142 or 144, respectively, is pulled up in voltage to the word line voltage. The bit line 120 or 110 connected to the word line 130 through a high resistance (AP state) magnetic junction 144 or 142, respectively, retains its voltage near floating. In some cases, the bit line 120 or 110 may float at most to approximately Vdd/4.

A differential read may be performed for the memory cells 140. The use of differential sensing may result in a high noise margin read. Further, no reference cell may be required for read operations. This may reduce sense amplifier and other external circuitry for the memory 100, thereby enabling further scaling. The magnetic junctions 142 and 144 may be optimized for fast a read based on high TMR and are decoupled from write the mechanism due to the SO torque-based write. Finally, during a hold (neither reading nor writing), the lines 110, 120 and 130 may be grounded.

Thus, the memory 100 is a cross-point memory including selectorless memory cells 140. The selectorless memory cells 140 utilize a combination of VCMA selection and SO torque writing. There may be a number of periphery transistors (selection devices) for word lines 130 and/or bit lines 110 and 120 at the edges of the array. However, individual memory cells 140 no longer require selection devices. As a result, the number of selection devices may be drastically reduced. The absence of selection devices may make the individual selectorless memory cell 140 ultra-scalable. The memory 100 may thus be scaled to higher areal densities. The modest voltages used in reading and writing to the magnetic junction 142 and 144 may allow the memory 100 to be embedded in logic devices. Because of the use of a differential read, the memory 100 may provide a high noise margin. The effect of write sneak paths are mitigated by the use of VCMA and SO torque writing, which may provide step function-like thresholding. Read sneak may be reduced by simultaneously reading the bit lines 110 and 120 from a single word line 130.

Figure 2:
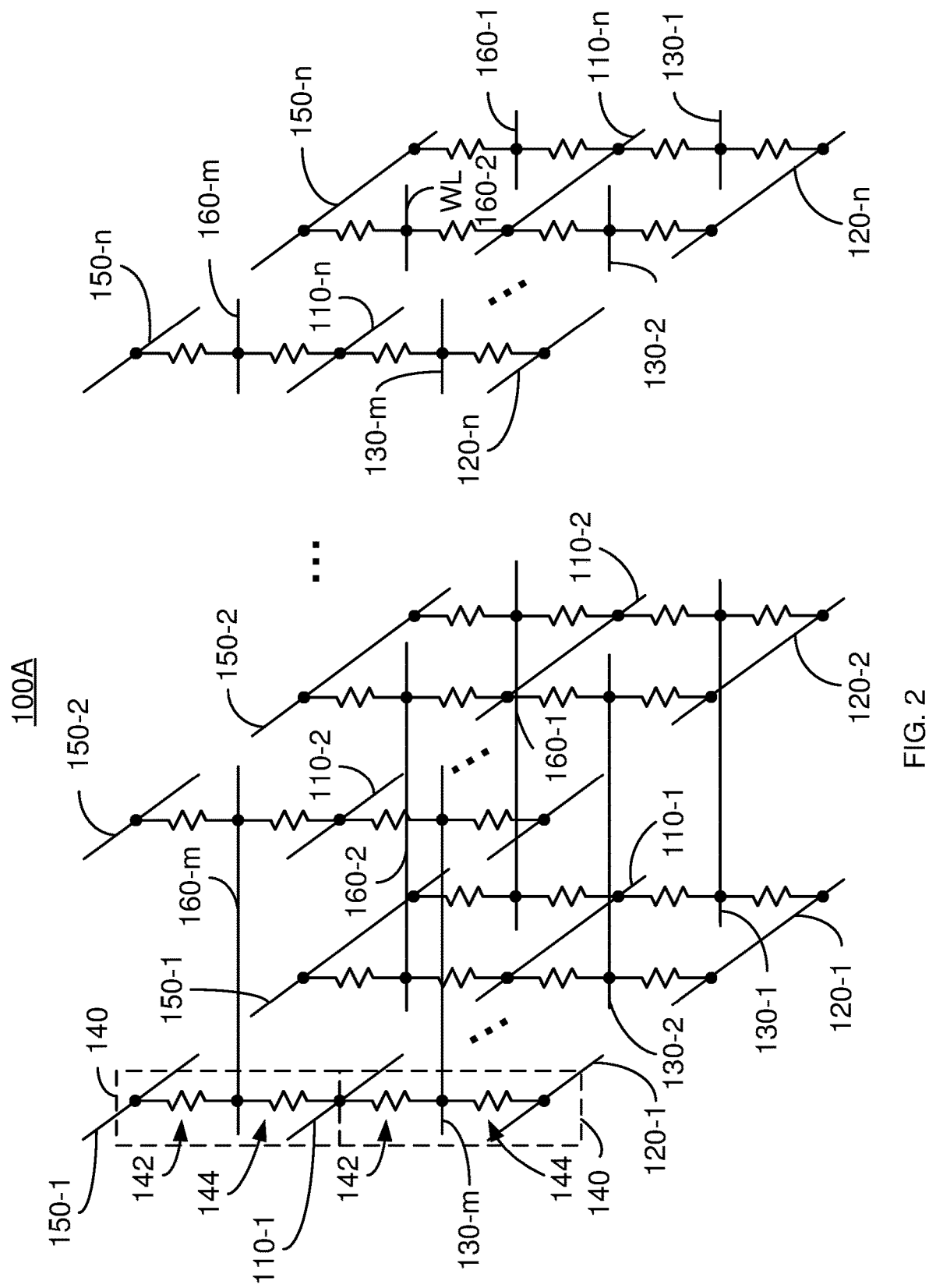
FIG. 2 depicts another exemplary embodiment of a portion of a three-dimensional, stackable selectorless memory.

An additional benefit of the memory 100 is that the memory 100 may be stacked in three dimensions (3D). FIG. 2 depicts an exemplary embodiment of a portion of a three-dimensional, 3D stackable selectorless memory 100A. The memory 100A includes two layers. Each layer includes an array of selectorless memory cells 140 analogous to those depicted in FIGS. 1A-1C. The first layer of the memory 100A is analogous to the memory 100 and includes word lines 130, bit lines 110 and 120, and m*n selectorless memory cells 140. The second layer includes additional word lines 160, additional bit lines 150 and an additional m*n selectorless memory cells 140. The additional bit lines 150 are analogous to the bit lines 120. The word lines 160 are analogous to the word lines 130. The first and second layers share bit lines 110. Although two layers are shown, additional layers might be stacked on the memory 100A or below the memory 100A. Thus, the memories 100 and 100A may be integrated vertically.

The selectorless memory 100A shares the benefits of the memory 100. For example, the memory 100A is selectorless, highly scalable, may be embedded in logic devices due to modest voltage requirements, and may exhibit high noise margins for read operations. Further, the memory 100A is stackable in 3D. This may allow for greater memory density and/or higher total storage capacity.

Figure 3A:
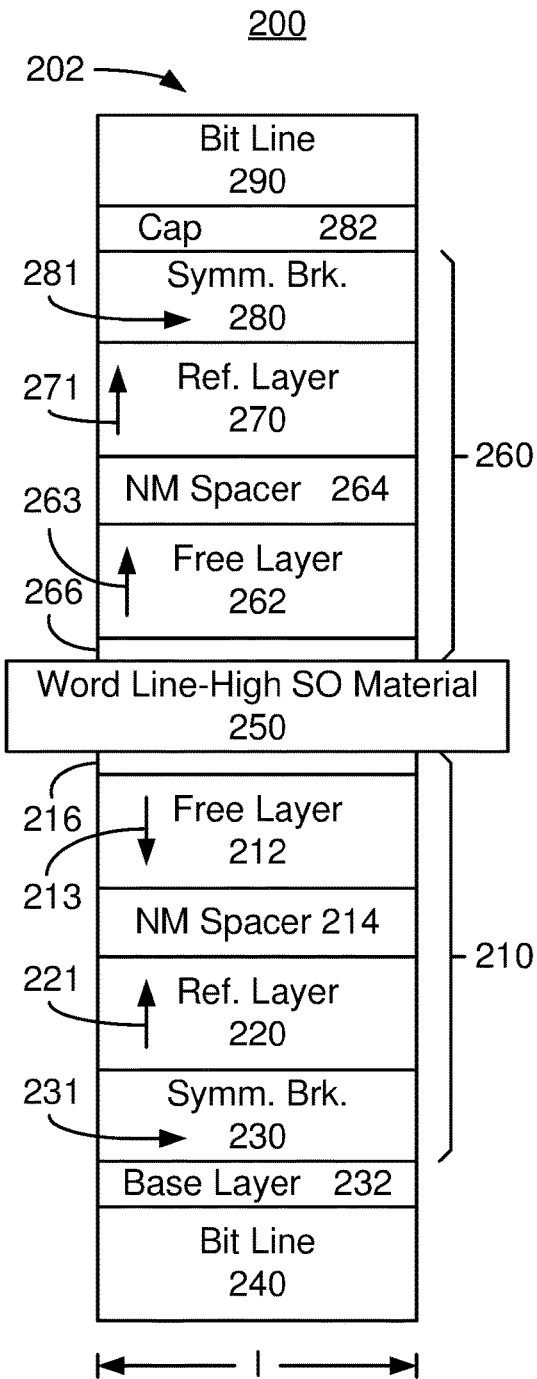
FIGS. 3A-3B depict exemplary embodiments of a portion of the selectorless memory in which the selectorless memory cells are in differing states.
Figure 3B:
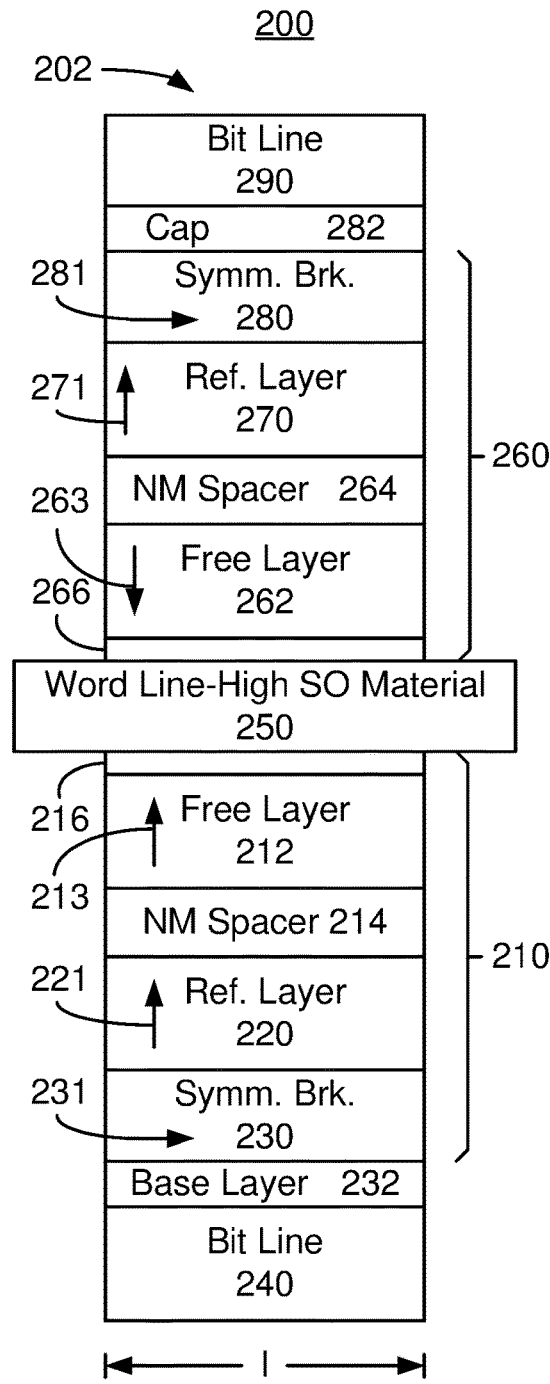

FIGS. 3A-3B depict a cross-sectional view of another exemplary embodiment of a portion of the selectorless memory 200. For clarity, FIGS. 3A-3B are not to scale. The selectorless memory 200 is analogous to the memory 100. Thus, the selectorless memory includes bit lines 240 and 290, word line 250 and memory cells 202 that are analogous to the bit lines 110 and 120, word line 130 and memory cells 140, respectively. Thus, the word line 250 includes high SO materials such as Pt, β-Ta and/or BiCu. The memory cell 202 includes magnetic junctions 260 and 210 that are analogous to magnetic junctions 142 and 144, respectively.

The magnetic junction 210 is analogous to the magnetic junction 144. The magnetic junction 210 is grown on an optional base (seed layer) 232 between the magnetic junction 210 and the bit line 240. The magnetic junction 210 includes a free layer 212, a nonmagnetic spacer layer 214 and a reference layer 220. Other layers such as polarization enhancement layers, seed and/or capping layers may be present but are not shown for simplicity. The magnetic junction 210 may also include a symmetry breaking layer 230 and an optional interaction moderation layer 216. The interaction moderation layer 216 may be used to control the interaction between the word line 250 and the free layer 212. For example, the interaction moderation layer 216 may be a thin Hf layer used to increase the SO torque on the free layer 212 due to the word line 250.

The reference layer 220 has a high perpendicular magnetic anisotropy (PMA) and a magnetic moment 231 that is substantially fixed during operation of the magnetic junction 210. Thus, the reference layer 220 has a PMA energy greater than a reference layer out-of-plane demagnetization energy. The moment 221 is stable perpendicular-to-plane. The reference layer 220 is shown as being a single layer. However, in other embodiments, the pinned layer 110 may be a multilayer. For example, the reference layer 220 might be a synthetic antiferromagnet (SAF) including multiple ferromagnetic layers interleaved with and sandwiching one or more nonmagnetic layers. In some embodiments, the reference layer may include two $(CoFe)_{(1-x)}Bx$ layers, where $0<x<1$, separated by a Ru layer. Such ferromagnetic layers may have a thickness of at least four nanometers and not more than ten nanometers. In other embodiments, the reference layer 220 might be some other multilayer and/or may have layer(s) coupled in another manner.

The nonmagnetic spacer layer 214 may be a tunneling barrier layer. For example, the nonmagnetic spacer 214 may be a crystalline MgO tunneling barrier with a (100) orientation. Such a nonmagnetic spacer layer 214 may not only enhance the tunneling magnetoresistance (TMR) of the magnetic junction 210, but also increase the PMA of the free layer 212. A crystalline MgO tunneling barrier layer 214 may have a thickness of at least one nanometer and not more than two nanometers. The MgO tunneling barrier 214 may be desired to be thicker to enhance VCMA. Other thicknesses are possible. Differential reading, discussed above, may assist in mitigating weaker read signals due to the thicker MgO tunneling barrier layer 214. In an alternate embodiment, the nonmagnetic spacer layer 214 may have another structure including but not limited to being a conductive layer.

The free layer 212 may have a high PMA. Thus, the free layer 212 has a PMA energy greater than a free layer out-of-plane demagnetization energy. The free layer magnetic moment 213 is stable perpendicular-to-plane. High PMA material(s) may be selected for the free layer 212. The free layer 212 may also be doped with material(s), such as not more than twenty atomic percent aluminum, to increase PMA and render the magnetic junction 210 more scalable. The magnetic moment 213 is changeable, allowing the free layer 212 to be used to store data. Thus, in FIG. 3A the free layer magnetic moment 213 is antiparallel to the reference layer magnetic moment 221 (AP state). In FIG. 3B, the free layer magnetic moment 213 is parallel to the reference layer magnetic moment 221 (P state). The free layer 212 is depicted as a single layer. However, in other embodiments, the free layer 212 may be a multilayer. For example, the free layer 212 might be a SAF. In other embodiments, the free layer 212 might be some other multilayer and/or may have layer(s) coupled in another manner. In some embodiments, the free layer may include or consist of a $(CoFe)_{1-y}B$ layer and/or a $(CoFe)_{1-y}Al_y$ layer where $0 \leq y < 1$. Other or additional alloys and/or multilayers may be used in other embodiments.

The free layer 212 is also configured to have a VCMA. As a result, the interfacial magnetic anisotropy between the free layer 212 and the nonmagnetic spacer layer is modulated by an applied voltage. As a result, the free layer more likely to be switched when the voltages in the word line 250 and bit line 240 are set for programming the selectorless memory cell 202. Similarly, the free layer 212 is less likely to be switched when the voltages in the word line 250 and bit line 240 are set for reading the selectorless memory cell 202. Consequently, the free layer 212 is more likely to be switched during programming than during a hold or a read operation.

The magnetic junction 210 may also include a symmetry breaking layer 230. The symmetry breaking layer 230 is present, for example, where the SO torque from the word line 250 is due to the spin Hall effect and where the SO torque is desired to program the free layer 212 in the absence of another effect. The symmetry breaking layer 230 is used to break the perpendicular-to-plane symmetry of the free layer 212. Thus, the symmetry breaking layer 230 provides an in-plane exchange bias driven perturbation, shown by arrow 231, to the magnetic moment 213 of the free layer 212. This allows a spin Hall torque, which is in-plane, to program the free layer 212. In some embodiments, the symmetry breaking layer 230 is an antiferromagnetic (AFM) layer. The AFM layer may include IrMn having a thickness of at least three nanometers and not more than five nanometers. An AFM symmetry breaking layer 230 may provide the in-plane perturbation 230 even though the layer 230 could have no net magnetic moment. In another embodiment, the symmetry breaking layer 230 may be a hard magnetic layer having a magnetic moment in-plane, a bilayer including a ferromagnetic layer exchange coupled to an AFM layer such that the ferromagnetic layer has a moment in-plane. Such layers may provide a small effective field (e.g. not more than five milliTesla) that perturbs the magnetic moment 213 of the free layer 212. Other single layers or multilayers may be used for the symmetry breaking layer 230.

The magnetic junction 260 is analogous to the magnetic junction 210. The magnetic junction 260 thus includes optional interaction moderation layer 266, free layer 262 having magnetic moment 263, nonmagnetic spacer layer 264, reference layer 270 having magnetic moment 271 and symmetry breaking layer 280 that are analogous to optional interaction moderation layer 216, free layer 212 having magnetic moment 213, nonmagnetic spacer layer 214, reference layer 220 having magnetic moment 221 and symmetry breaking layer 230, respectively. Thus, the free layer 262 may be programmed via SO torque, has a high PMA and VCMA. The reference layer 270 also has a high PMA. However, the order of the components may be reversed such that the free layer 262 is closest to the word line 250. Also shown is capping layer 292 between the magnetic junction 260 and the bit line 290. The capping layer may include material(s) such as Ta.

The magnetic junctions 210 and 260 are configured such that the reference layer magnetic moments 221 and 271 are parallel. The free layers 212 and 262 are written by the same write current driven through the word line 250 and are on opposite sides of the word line 250. Consequently, an SO torque due to the spin Hall effect programs the free layers 212 and 262 to have antiparallel magnetic moments. As a result, the magnetic junction 260 is in the P state when the magnetic junction 210 is in the AP state and vice versa. As with the magnetic junctions 142 and 144, the magnetic junctions 210 and 260 are written to complementary states. These configurations are shown in FIGS. 3A and 3B. In FIG. 3A, the magnetic junction 260 is in the low resistance (P) state and the magnetic junction 210 is in the high resistance (AP) state. In FIG. 3B, the magnetic junction 260 is in the high resistance (AP) state and the magnetic junction 210 is in the low resistance (P) state.

The memory 200 using selectorless memory cells 202 shares the benefits of the magnetic memories 100 and 100A. For example, the memory 200 is selectorless, using VCMA of the magnetic junctions 210 and 260 to select memory cells. The memory cells 202 are thus highly scalable. The magnetic junctions 210 and 260 are also programmable using SO torque generated by the word line 250. The memory 200 may be embedded in logic devices due to modest voltage requirements for programming the magnetic junctions 210 and 260. The memory 200 may have exhibit high noise margins due to the use of a differential read. The memory 200 is also stackable in 3D. Multiple layers analogous to the one shown but sharing bit lines may be included in a manner analogous to the memory 100A. This may allow for greater memory density and/or higher total storage capacity.

The selectorless memory 200 may also have a higher in-plane memory density due to the high PMA of the layers. The magnetic junctions 210 and 260 have their moments oriented perpendicular-to-plane and stabilized by the high PMA of the layers. Consequently, the length, l, and width (perpendicular to the plane of the page) may be reduced over a conventional in-plane magnetic junction. In some embodiments, the magnetic junctions 210 and 260 have a circular footprint such that the length and width are the same. The diameter/length of the magnetic junctions 210 and 260 may be less than forty nanometers. In some embodiments, the length and/or diameter may not exceed thirty nanometers. In addition to providing increased memory density through vertical stacking and high scalability, the memory 200 may have an increased areal density.

Figure 4:
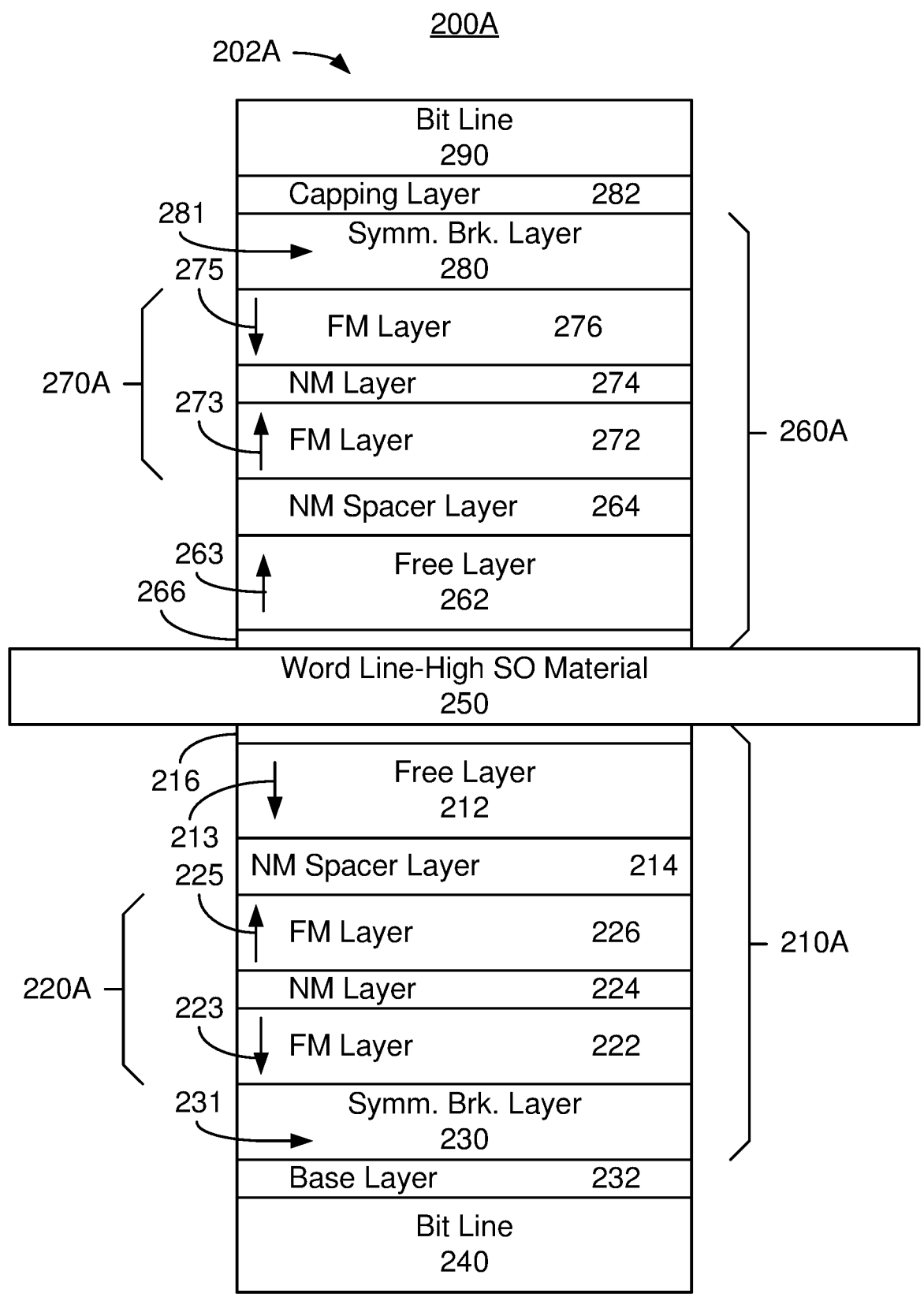
FIG. 4 depicts another exemplary embodiment of portion of a selectorless memory.

FIG. 4 depicts another exemplary embodiment of portion of a selectorless memory 200A. The selectorless memory 200A is analogous to the memory 200. Consequently, analogous components have similar labels. The memory 200A includes word lines 250, bit lines 240 and 290 and selectorless memory cells 202A that are analogous to the word lines 250, bit lines 240 and 290, and selectorless memory cells 202, respectively. The magnetic junctions 210A and 260A are analogous to the magnetic junctions 210 and 260, respectively. However, the reference layers 220A and 270A are explicitly SAFs. Thus, the reference layer 220A includes ferromagnetic layers 222 and 226 separated by nonmagnetic layer 224. The nonmagnetic layer may be a Ru layer. The thickness of the Ru layer may be selected so that the ferromagnetic layers 222 and 226 are antiferromagnetically coupled via a Ruderman-Kittel-Kasuya-Yosida (RKKY) coupling. Consequently, the magnetic moments 223 and 225 of the layers 222 and 226, respectively, are antiparallel. Similarly, the reference layer 270A includes ferromagnetic layers 272 and 276 separated by nonmagnetic layer 274. Consequently, the magnetic moments 273 and 275 of the layers 272 and 276, respectively, are antiparallel. The moments 225 and 263 of the ferromagnetic layers 226 and 272 closest to the free layers 212 and 262 are parallel.

The memory 200A functions in an analogous manner to the memories 100, 100A and 200. Thus, the memory 200A shares the benefits of the memories 100, 100A and 200. For example, the memory 200 is selectorless and highly scalable, using VCMA of the magnetic junctions 210A and 260A to select memory cells. The magnetic junctions 210A and 260A are also programmable using SO torque generated by the word line 250. The memory 200 may be embedded in logic devices due to modest voltage requirements for programming the magnetic junctions 210A and 260A. The memory 200A may have exhibit high noise margins due to the use of a differential read and is stackable in 3D. This may allow for greater memory density and/or higher total storage capacity. The selectorless memory 200A may have a higher in-plane density because the magnetic junctions 210A and 260A have high PMA. In addition to providing increased memory density through vertical stacking, the memory 200 may have an increased areal density.

Figure 5:
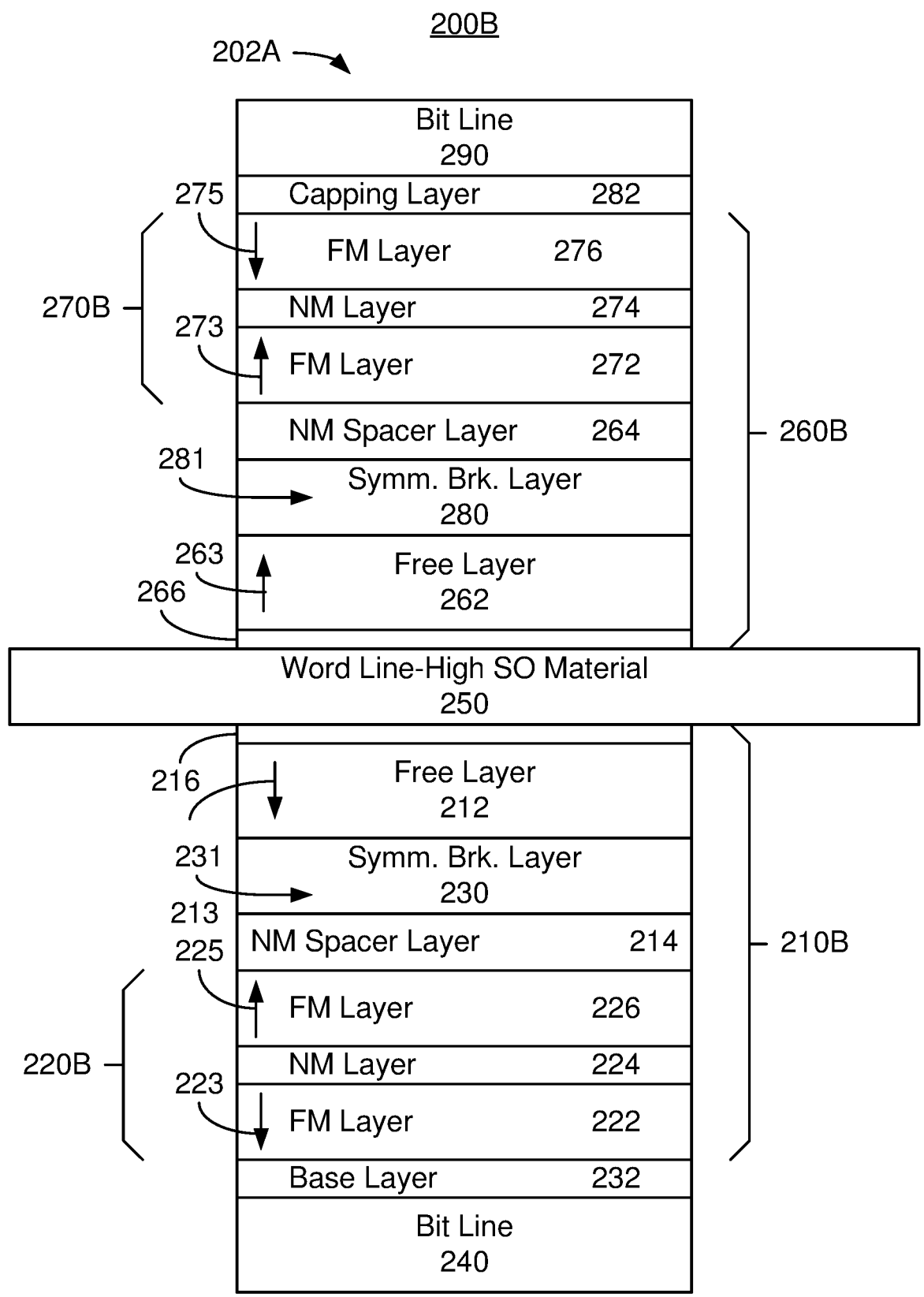
FIG. 5 depicts another exemplary embodiment of portion of a selectorless memory.

FIG. 5 depicts another exemplary embodiment of portion of a selectorless memory 200B. The selectorless memory 200B is analogous to the memories 200 and 200A. Consequently, analogous components have similar labels. The memory 200B includes word lines 250, bit line 240 and 290 and selectorless memory cells 202B that are analogous to the word lines 250, bit lines 240 and 290, and selectorless memory cells 202/202A, respectively. The magnetic junctions 210B and 260B are analogous to the magnetic junctions 210/210A and 260/260A, respectively. The reference layers 220B and 270B are explicitly SAFs.

In addition, the locations of the symmetry breaking layers 230 and 280 have been moved. The symmetry breaking layer 230 is between the free layer 212 and the nonmagnetic spacer layer 214. The symmetry breaking layer 280 is between the free layer 262 and the nonmagnetic spacer layer 264. This location may allow the symmetry breaking layers 230 and 280 to more readily affect the magnetic symmetry of the free layers 212 and 262, respectively. However, the tunneling magnetoresistance is expected to degrade.

The memory 200B functions in an analogous manner to the memories 100, 100A, 200 and 200A. Thus, the memory 200B shares the benefits of the memories 100, 100A, 200 and 200A. For example, the memory 200 is selectorless, highly scalable, uses VCMA of the magnetic junctions 210B and 260B to select memory cells and uses SO torque generated by the word line 250 to program the magnetic junctions 210B and 260B. The memory 200 may be embedded in logic devices due to modest voltage requirements for programming the magnetic junctions 210B and 260B. The selectorless memory 200B may have exhibit high noise margins due to the use of a differential read. The differential read may be more desirable in this embodiment because of the expected reduction in TMR (read signal). The selectorless memory 200B is stackable in 3D. This may allow for greater memory density and/or higher total storage capacity. The selectorless memory 200B may have a higher in-plane density because the magnetic junctions 210B and 260B have high PMA. In addition to providing increased memory density through vertical stacking, the memory 200 may have an increased areal density.

Various features have been described with respect to the selectorless memories 100, 100A, 200, 200A and 200B. One of ordinary skill in the art will recognize that these features may be combined in manner(s) not shown and which are not inconsistent with the devices and methods described herein. Thus, a selectorless memory and/or its components in accordance with the methods, systems and devices described herein need not be explicitly depicted.

Figure 6:
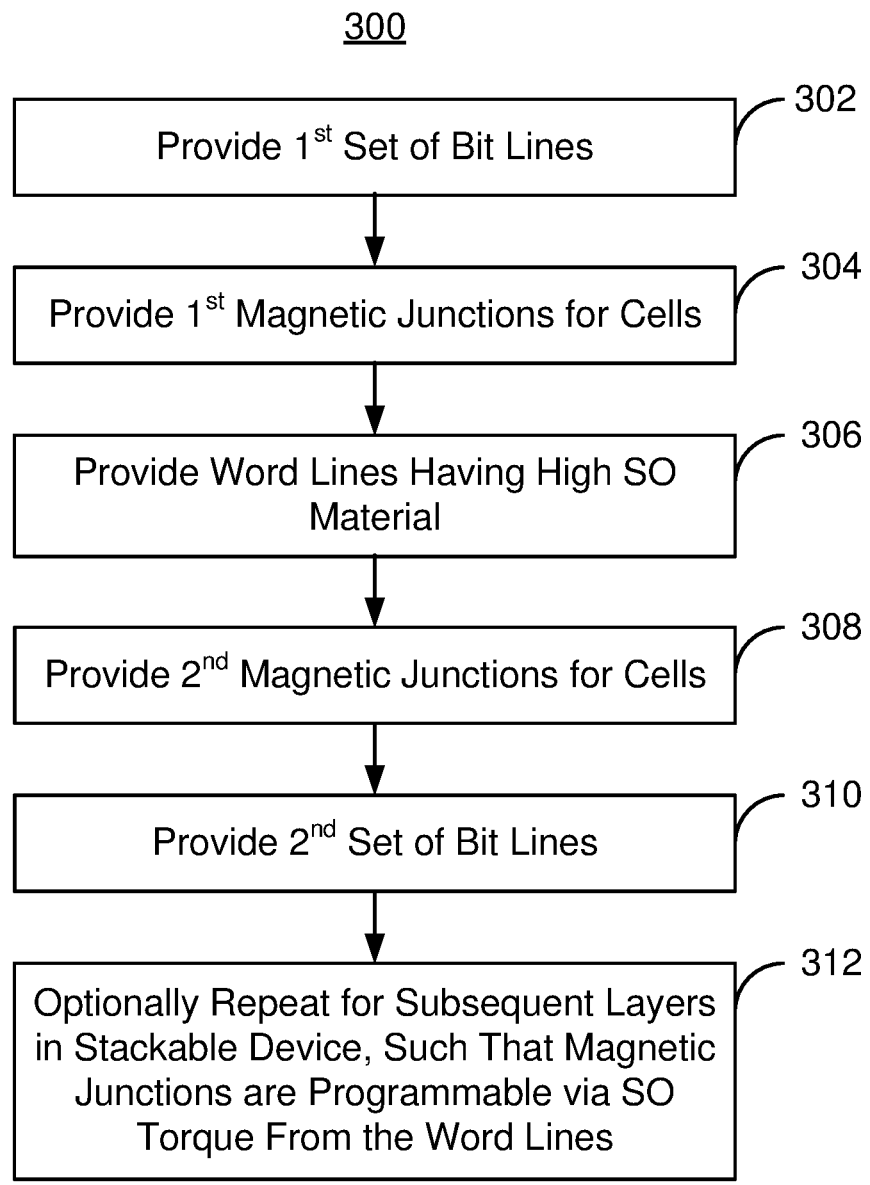
FIG. 6 is a flow chart depicting an exemplary embodiment of a method for providing a three-dimensional selectorless stackable memory.

FIG. 6 is a flow chart depicting an exemplary embodiment of a method 300 for providing a three-dimensional selectorless stackable memory such as the memories 100, 100A, 200, 200A and/or 200B. For simplicity, some steps may be omitted, performed in another order and/or combined. Further, the method 300 may start after other steps in forming the memory have been performed. The method 300 is also described in the context of the memory 100. However, another selectorless memory, such as the memories 100A, 200, 200A and/or 200B, might be fabricated.

Step 302: Bit lines 120 are provided. In some embodiments, a damascene process may be used to form conductive lines in an insulating layer. Alternatively, high conductivity layer(s) for the bit lines are blanket deposited and then patterned into bit lines 120 using photolithography. A dielectric layer covering the bit lines 120 is deposited and planarized to exposed the bit lines 120. A contact for the magnetic junction 142 may also be formed.

Step 304: A portion of the selectorless memory cells 140 are formed. Stated differently, the magnetic junctions 144 are fabricated. A magnetic junction stack including the layers for the magnetic junction are deposited on the bit lines. For example, the base (seed) layer 232, symmetry breaking layer 230, reference layer 220, nonmagnetic spacer layer 214, free layer 212 and interaction moderation layer 216 may be deposited across the surface of the wafer. A mask process may then be used to etch portions of the magnetic junction stack. The mask covers the portions of the magnetic junction stack that are electrically connected to the bit lines 120 and that will form the magnetic junctions 144. The exposed portions of the magnetic junction stack are removed. A dielectric layer (not shown) is deposited on the magnetic junctions 144. The dielectric layer may be planarized such that the remaining portion of the dielectric layer fills the regions between the magnetic junctions 144 for different memory cells. A top contact for the magnetic junctions 144 may also be formed. Thus, the magnetic junctions 144 that are programmable via SO torque and that are selected using VCMA are provided.

Step 306: The word lines 130 are provided. Material(s) for the word lines 130 having high SO torque are deposited. For example, material(s) such as Pt, 13-Ta and/or BiCu may be blanket deposited. A mask covering the portions of the high SO torque material(s) that will form the word lines 130 is provided. The exposed portion of the layers are removed to form the word lines 130 perpendicular to the bit lines 120. The magnetic junctions 144 reside at regions in which the word lines 130 cross the bit lines 120. An insulating layer (not shown) is deposited on the word lines 130 and planarized to expose the word lines 130. Contacts for the magnetic junctions 142 may also be formed on the word line 130.

Step 308: A remaining portion of the selectorless memory cells 140 are formed. Stated differently, the magnetic junctions 142 are fabricated. The process used may be analogous to that followed for the magnetic junctions 144. A magnetic junction stack including the layers for the magnetic junction 142 are deposited on the bit lines. The interaction moderation layer 266, free layer 262, nonmagnetic spacer layer 264, reference layer 270, symmetry breaking layer 280 and capping layer 282 may be deposited across the surface of the wafer. A mask process may then be used to etch portions of the magnetic junction stack. A hard mask covers the portions of the magnetic junction stack that are electrically connected to the word lines 130 and that will form the magnetic junction 142. The exposed portions of the magnetic junction stack are removed. A dielectric layer (not shown) is deposited on the magnetic junctions 142. The dielectric layer may be planarized such that the remaining portion of the dielectric layer fills the regions between the magnetic junctions 142 for different memory cells. A top contact (not shown) for the magnetic junction 142 may also be formed. Thus, the magnetic junctions 142 that are programmable via SO torque and that are selected using VCMA are provided.

Step 310: Bit lines 110 are fabricated. High conductivity layer(s) for the bit lines are blanket deposited and then patterned into bit lines 110 using a mask process. The bit lines 110 may be substantially parallel to the bit lines 120 and located such that the magnetic junctions 142 reside in the regions that the bit lines 120 cross the word lines 130. A dielectric layer covering the bit lines is deposited and planarized. Fabrication of the device 100 may then be completed.

Using the steps 302 through 310, the selectorless memory 100 may be formed. However, the memory 100 is a 3D stackable memory. Additional layers analogous to the memory 100 may be formed. Thus, the steps 304 through 310 may be repeated, via step 312. The steps are repeated so that the free layers of each magnetic junction 142 and 144 are closer to the corresponding word line 130/160 and so that adjoining layers share bit lines 110 or 120. For example, the magnetic junctions 142 and 144, word lines 160 and additional bit lines 150 may be formed.

Thus, using the method 300, the memories 100, 100A, 200, 200A, 200B and/or an analogous selectorless memory having high PMA cells programmed via SO torque and selected using VCMA may be formed. As a result, the advantages of one or more the memories 100, 100A, 200, 200A and/or 200B may be achieved.

Figure 7:
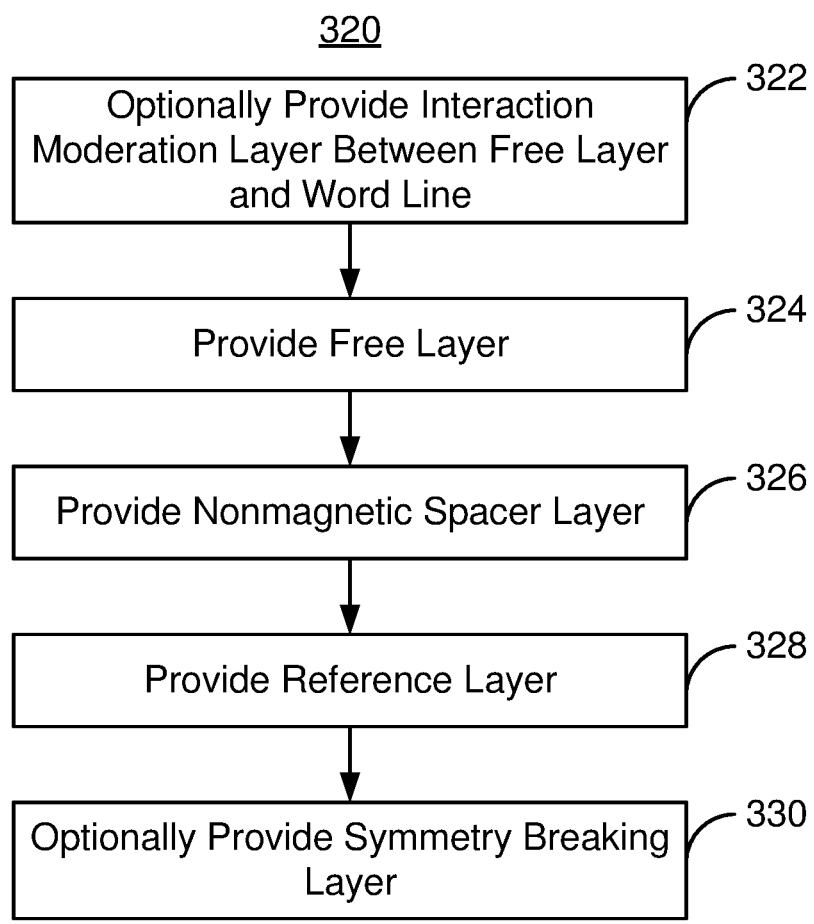
FIG. 7 is a flow chart depicting an exemplary embodiment of a method for providing a magnetic junction usable in a selectorless memory cell, programmable using spin orbit torque and selected via a voltage controlled magnetic anisotropy.

FIG. 7 is a flow chart depicting an exemplary embodiment of a method 320 for providing a magnetic junction for a cell of a three-dimensional memory such as the memories 100, 100A, 200, 200A and/or 200B. For simplicity, some steps may be omitted, performed in another order and/or combined. Further, the method 320 may start after other steps in forming the memory have been performed. The method 320 is also described in the context of the memory 200 and magnetic junction 260. However, other magnetic junctions such as magnetic junctions 210, 210A, 260A, 210B and/or 260B for another selectorless memory, such as the memories 100A, 200, 200A and/or 200B might be formed.

The interaction moderation layer 266 may be provided, via step 322. Step 322 may include, for example, providing a dusting of Hf. In other embodiments, step 322 may be omitted. The free layer 262 is provided, via step 324. Step 324 thus includes depositing materials for a layer that exhibits the desired VCMA and is programmable using SO torque. The free layer 262 provided in step 324 is also desired to have a high PMA, as discussed above. The nonmagnetic spacer layer 264 is provided, via step 326. Step 326 may include depositing an MgO layer and annealing the layer to provide a crystalline MgO layer having the desired orientation. The reference layer 270 is provided, via step 328. Step 328 may include providing a SAF, such as the reference layers 270A and 270B. In addition, the reference layer provided in step 328 has a high PMA. The symmetry breaking layer 280 is also provided, via step 330. For the magnetic junctions 260 and 260A, step 330 is performed after step 328. For the magnetic junction 260B, step 330 is performed after step 324 and before step 326. Although described as providing various layers, one of ordinary skill in the art will recognize that step 322-330 generally deposit all of the layers in a stack, and then define the individual magnetic junctions via photolithography.

The method 320 in the order described above may provide the magnetic junctions 142, 260, 260A and 260B, which reside on the word line 130/250. For the magnetic junctions 144, 210, 210A and 210B, the order is different. For the magnetic junctions 210 and 210A, the order of the steps may be reversed (330, 328, 326, 324, 322). For the magnetic junction 210B, the order of the steps may be reversed except that step 330 may be performed between steps 324 and 322 (328, 326, 324, 330, 322).

Thus, using the method 320, magnetic junctions 142, 144, 210, 260, 210A, 260A and/or 260B for the memories 100, 100A, 200, 200A, 200B and/or an analogous selectorless memory having cells programmed via SO torque and selected using VCMA may be formed. As a result, the advantages of one or more the memories 100, 100A, 200, 200A and/or 200B may be achieved.

A method and system for providing a selectorless 3D stackable memory has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A memory device comprising:
   a plurality of word lines;
   a first plurality of bit lines;
   a second plurality of bit lines;
   a plurality of selectorless memory cells, a selectorless memory cell of the plurality of selectorless memory cells being coupled with a word line of the plurality of word lines, with a first bit line of the first plurality of bit lines and with a second bit line of the second plurality of bit lines, the selectorless memory cell including a plurality of magnetic junctions, the word line being coupled between a first magnetic junction and a second magnetic junction of the plurality of magnetic junctions, the first magnetic junction and the second magnetic junction being programmable using a spin-orbit interaction torque (SOT), the first bit line being coupled with the first magnetic junction, the second bit line being coupled with the second magnetic junction;
   wherein the selectorless memory cell is selected for a write operation based on voltages in the word line, the first bit line and the second bit line
   wherein at least one of the plurality of magnetic junctions in the selectorless memory cell includes a reference layer, a nonmagnetic spacer layer, a free layer programmable using the SOT and a symmetry breaking layer, the nonmagnetic spacer layer being between the free layer and the reference layer, the symmetry breaking layer providing a magnetic perturbation on the free layer.

2. The memory device of claim 1 wherein each of the plurality of magnetic junctions includes:
   the reference layer;
   the nonmagnetic spacer layer;
   the free layer programmable using the SOT; and
   the symmetry breaking layer; and
   wherein the word line includes a spin-orbit interaction (SO) material and is coupled with the free layer of the first magnetic junction and the free layer of the second magnetic junction.

3. The memory device of claim 2 wherein the each of the plurality of memory cells is configured for a differential read.

4. The memory device of claim 2 wherein the word line has a cross-sectional height not exceeding five nanometers.

5. The memory device of claim 2 wherein the reference layer has a reference layer perpendicular magnetic anisotropy greater than a reference layer out-of-plane demagnetization energy and wherein the free layer has a free layer perpendicular magnetic anisotropy greater than a free layer out-of-plane demagnetization energy.

6. The memory device of claim 2 wherein the reference layer is a synthetic antiferromagnet and the nonmagnetic spacer layer is a tunneling barrier layer.

7. The memory device of claim 2 wherein the selectorless memory cell further includes:
   an interaction moderation layer between the free layer and the word line.

8. The memory device of claim 2 wherein the word line adjoins the free layer of the first magnetic junction and the free layer of the second magnetic junction.

9. The memory device of claim 2 wherein the symmetry breaking layer includes at least one of: an antiferromagnetic layer, a hard magnetic layer and a bilayer including the antiferromagnetic layer and a magnetic layer magnetically coupled to the antiferromagnetic layer.

10. The memory device of claim 7 wherein the symmetry breaking layer has a location selected from a first location and a second location, the first location being adjacent to the reference layer such that the reference layer is between the nonmagnetic spacer layer and the symmetry breaking layer, the second location being between the free layer and the nonmagnetic spacer layer.

11. The memory device of claim 1 wherein first plurality of bit lines are substantially parallel to the second plurality of bit lines and wherein the plurality of word lines are substantially perpendicular to the first plurality of bit lines.

12. The memory device of claim 1 wherein the memory device is a three-dimensional stackable memory device includes a plurality of levels, each of the plurality of levels including the plurality of word lines, the first plurality of bit lines, the second plurality of bit lines and the plurality of selectorless memory cells, the first plurality of bit lines for one of the plurality of levels serving as the second plurality of bit lines for an adjoining level of the plurality of levels.

13. A three-dimensional stackable memory device comprising:
   a plurality of levels, each of the plurality of levels including a plurality of word lines, a first plurality of bit lines, a second plurality of bit lines and a plurality of selector less memory cells, the first plurality of bit lines for one of the plurality of levels serving as the second plurality of bit lines for an adjoining level of the plurality of levels, wherein
      the plurality of word lines include a spin-orbit interaction (SO) material;
      the first plurality of bit lines is perpendicular to the first plurality of word lines;
      the second plurality of bit lines is parallel to the first plurality of bit lines;
      each of the plurality of selectorless memory cells includes a plurality of magnetic junctions, each of the plurality of magnetic junctions includes a symmetry breaking layer, a reference layer, a free layer programmable using a spin-orbit interaction torque (SOT) and a nonmagnetic spacer layer between the free layer and the reference layer, the reference layer being between the symmetry breaking layer and the nonmagnetic spacer layer, the symmetry breaking layer providing a magnetic perturbation on the free layer, a word line of the plurality of word lines being coupled between the free layer of a first magnetic junction and the free layer of a the second magnetic junction, a first bit line of the first plurality of bit lines being coupled with the symmetry breaking layer of the first magnetic junction, a second bit line of the second plurality of bit lines being coupled with the symmetry breaking layer of the second magnetic junction.

14. The memory device of claim 1 wherein the magnetic perturbation is not more than five milliTelsa.

15. The memory device of claim 1 wherein the magnetic perturbation is in a direction substantially perpendicular to a free layer magnetic symmetry.

16. The memory device of claim 9 wherein the symmetry layer is the antiferromagnetic layer.

* * * * *